United States Patent
Chen et al.

(10) Patent No.: US 8,248,814 B2
(45) Date of Patent: Aug. 21, 2012

(54) PRINTED CIRCUIT BOARD AND VOLTAGE/CURRENT MEASURING METHOD USING THE SAME

(75) Inventors: Chun-Po Chen, Tu-Cheng (TW); Chi-Wen Chen, Taipen Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/909,857

(22) Filed: Oct. 22, 2010

(65) Prior Publication Data

US 2011/0317380 A1  Dec. 29, 2011

(30) Foreign Application Priority Data

Jun. 28, 2010 (TW) ................ 99121124 A

(51) Int. Cl.
*H05K 7/10* (2006.01)
(52) U.S. Cl. ........ 361/767; 361/752; 361/808; 361/771; 174/557; 174/256
(58) Field of Classification Search ........... 361/767, 361/771, 777, 752, 808; 174/557, 250, 262, 174/268
See application file for complete search history.

(56) References Cited

U.S. PATENT DOCUMENTS

| | | | |
|---|---|---|---|
| 5,270,673 A * | 12/1993 | Fries et al. ............ | 333/246 |
| 2007/0010086 A1* | 1/2007 | Hsieh .................... | 438/622 |
| 2007/0152768 A1* | 7/2007 | Mellitz et al. ........... | 333/1 |

* cited by examiner

*Primary Examiner* — Yuriy Semenenko
*Assistant Examiner* — Andargie M Aychillhum
(74) *Attorney, Agent, or Firm* — Altis Law Group, Inc.

(57) ABSTRACT

A PCB includes an outer layer and an inner layer. An electronic component is mounted on the outer layer. The outer layer further defines a first pad, a second pad, a third pad, a fourth pad, and a number of via holes. The electrical performances of the first pad and the second pad are the same to that of the inner layer. The first pad and the second pad are conducted to the electronic component. The third pad and the fourth pad are respectively conducted to the first pad and the second pad through the electronic component. The electrical performances of the third pad and the fourth pad are different from that of the inner layer. The via holes are respectively electrically connected to the third pad and the fourth pad.

8 Claims, 3 Drawing Sheets

PRINTED CIRCUIT BOARD AND VOLTAGE/CURRENT MEASURING METHOD USING THE SAME

BACKGROUND

1. Technical Field

The present disclosure relates to circuit carriers, and more particularly to a printed circuit board (PCB) and a voltage/current measuring method using the same.

2. Description of Related Art

Some special printed circuit boards (PCBs) for communication products often employ a DC/DC PWM circuit to achieve special functions. Generally, the voltage/current of the DC/DC PWM circuit is often achieved by measuring an inductance characteristic DC impedance of an electronic component of the DC/DC PWM circuit.

Typically, the layout of the DC/DC PWM needs to be designed by an auto-layout design software, e.g. CADENCE ALLEGRO PCB Editor. When the electrical performance of the electronic component is recognized to be same to that of a power plane of the PCB by the auto-layout design software, the electronic component will be electrically connected to the power plane by default. As a result, when measuring the DC impedance of the electronic component, the impedance of the power plane also will be additionally measured, thus an unexpected impedance is lead in, and the measurement of the voltage/current of the electronic component also will be incorrect.

What is needed, therefore, is a PCB and a voltage/current measuring method using the same which can overcome the above-described problem.

BRIEF DESCRIPTION OF THE DRAWINGS

The details of the disclosure, both as to its structure and operation, can best be understood by referring to the accompanying drawings, in which like reference numbers and designations refer to like elements.

DETAILED DESCRIPTION

Figure 1:
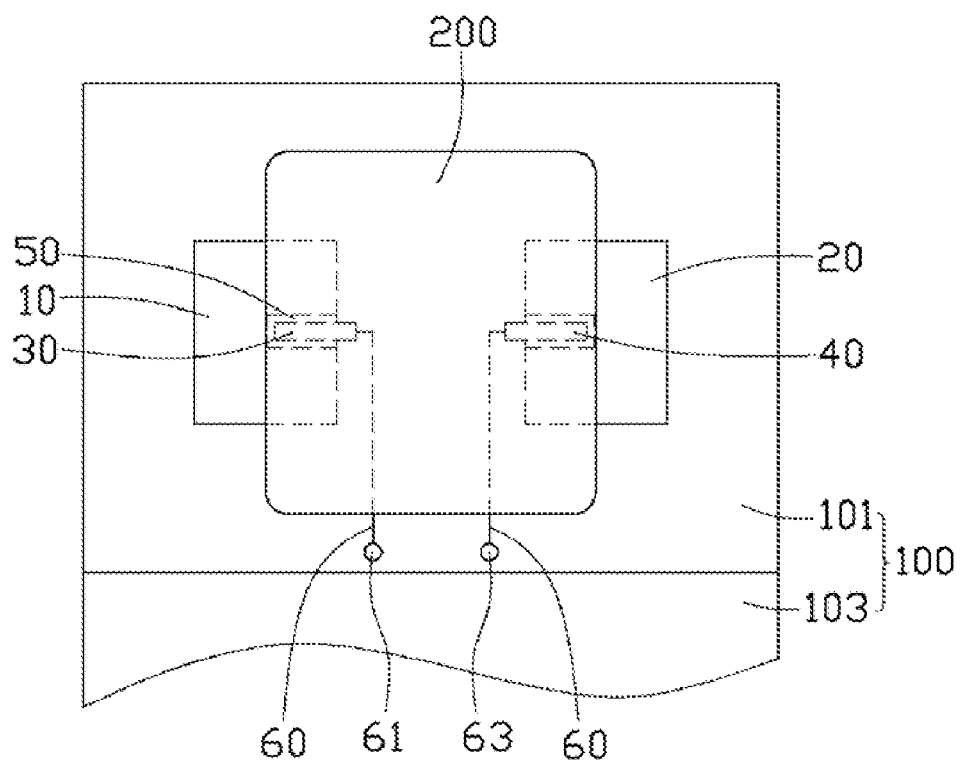
FIG. 1 is a schematic diagram illustrating one embodiment of a printed circuit board (PCB).
Figure 2:
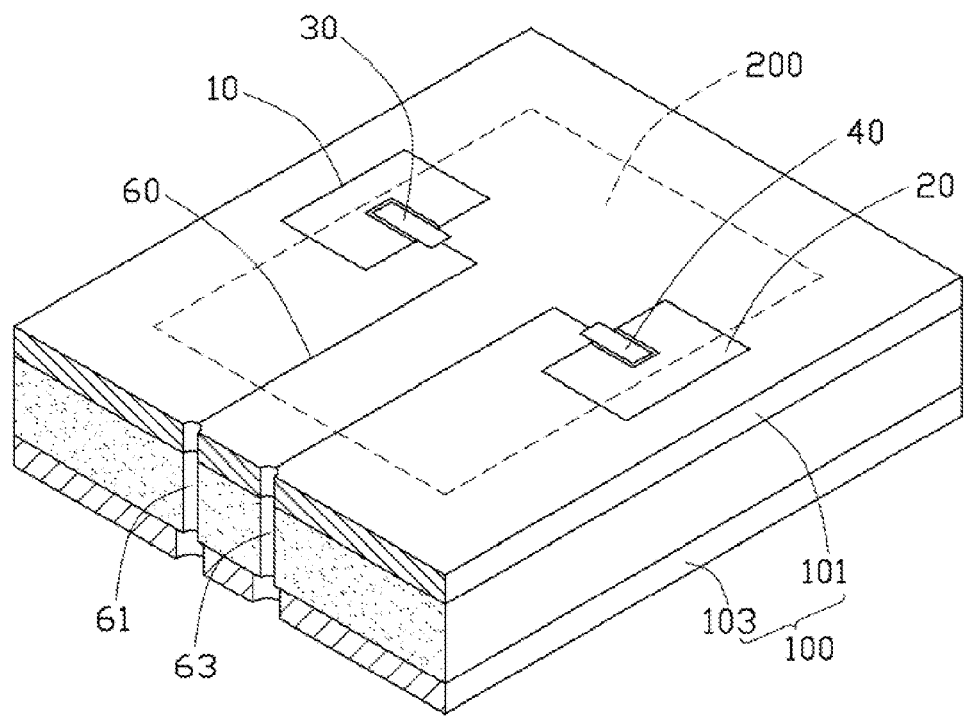
FIG. 2 is an isometric, cut-away view of the PCB of FIG. 1.

Referring to FIGS. 1 and 2, a printed circuit board (PCB) 100 in accordance with an embodiment of the present disclosure, is shown. The PCB 100 includes an outer layer 101 for being mounted a number of electronic components 200, and at least one inner layer 103 capable of communicating with the outer layer 101. In the present embodiment, the outer layer 101 and the inner layers 103 are copper layers.

Inherently, the PCB 100 includes a layout on the outer layer 101 and another layout on the inner layer 103, to achieve the desirable electrical performances of the PCB 100. The layouts are designed by an auto-layout design software, e.g. CADENCE ALLEGRO PCB 100 Editor. The layout includes a number of pads (detail described below), a number of traces (detail described below), and a number of via holes (detail described below) connected to the pads via the traces. Note that the "via hole" generally is a route from one copper layer to another to allow interconnection therebetween. The auto-layout design software can distinguish the electrical performances of the pads and the inner layer 103, to determine that if the electrical performances of the pads are the same to that of the inner layer 103. Generally, if the electrical performances of the pads are the same to that of the inner layer 103, the pads are designed to be electrically connected to the inner layer 103 through the via holes by default. If the electrical performances of the pads are different from that of the inner layer 103, the pads are designed to automatically avoid electrical connection to the inner layer 103 by default.

At least one of the electronic components 200 is configured to be detected by a detecting device (e.g. a voltmeter or an ammeter, not shown), to measure the voltage/current of the electronic component 200. In one embodiment, the electronic component 200, e.g. inductors or resistors, can be mounted on the outer layer 101 by surface mount technology (SMT). In the present embodiment, the electronic component 200 to be detected is an inductor. In other embodiments, the electronic component 200 to be detected also can be a component having inductance or resistance characteristics. The inner layer 103 is a power plane or a signal layer. The electronic component 200 includes at least two installation pads (not shown) to be soldered to the outer layer 101.

The outer layer 101 defines at least one first pad 10 and at least one second pad 20 adjacent to the at least one first pad 10, correspondingly to the installation pads of the electronic component 200. The area of the first pad 10 or the second pad 20 is substantially equal to that of the installation pads of the electronic component 200 to be detected. Two adjacent edges of the first pad 10 and the second pad 20 respectively define a cutout 50 extending to the center of the first pad 10 and the second pad 20. In the present embodiment, each cutout 50 is defined on the middle of the edge. The electrical performances of the first pad 10 and the second pad 20 are the same to that of the inner layer 103.

The outer layer 101 further defines at least one third pad 30 and at least one fourth pad 40 for the purpose of voltage/current measurement.

The third pad 30 and the fourth pad 40 are respectively and partly received in the cutout 50 of the first pad 10 and the second pad 20. In detail, the third pad 30 and the fourth pad 40 are respectively positioned substantially in the central area of the first pad 10 and the second pad 20, symmetrically, with part of the edge surrounded by the first pad 10 and the second pad 20. It is understood that the third pad 30 and the fourth pad 40 also can be symmetrically defined at the corresponding corners of the first pad 10 and the second pad 20. Furthermore, the copper between the first pad 10 and the third pad 30 is removed to insulate the first pad 10 from the third pad 30. Similarly, the copper between the second pad 20 and the fourth pad 40 is also removed to insulate the second pad 20 from the fourth pad 40. The shapes of the third and fourth pads 30 and 40 are rectangular. Note that the third and fourth pads 30 and 40 also can be in other shapes, such as circles or triangles. In one embodiment, the size (e.g. the length and the width) of the third pad 30 is smaller than that of the first pad 10. The size of the fourth pad 40 is smaller than that of the second pad 20. The electrical performance of the third pad 30 is different from that of the first pad 10, that is, different from the inner layer 103. The electrical performance of the fourth pad 40 is different from that of the second pad 20, that is, different from the inner layer 103. As such, when the via holes are designed to be connected to the third pad 30 and the fourth pad 40, the via holes will automatically avoid electrical connection to the inner layer 103 by default. Thus, the third pad 30 and the fourth pad 40 will not be electrically connected to the inner layer 103.

Back to describe the detail of the via holes, the via holes includes a number of first via holes 61 and a number of second via holes 63 defined on the PCB 100. At least one pair of traces 60 for transmitting signals are structured on the outer layer 101 and are respectively lead from the third pad 30 and the fourth pad 40. At least one first via hole 61 is connected to the third pad 30 through one of the traces 60. At least one second via hole 63 is connected to the fourth pad 40 through the other trace 60.

When in assembly, one installation pad of the electronic component 200 is soldered on the first and third pads 10 and 30 by soldering paste at the same time, the other installation pad of the electronic component 200 is soldered on the second and fourth pads 20 and 40 by soldering paste at the same time. Thus, the first pad 10, the second pad 20, and the third pad 30, the fourth pad 40 can be respectively conducted to the electronic component 200.

When detecting the voltage/current of the electronic component 200, the first via hole 61 and the second via hole 63 are connected to the detecting device via detectors of the detecting device. Due to the different electrical performances between the third pad 30/the fourth pad 40 and the inner layer 103, the first via hole 61 and the second via hole 63 may be automatically avoidable to electrically connect to the inner layer 103 in design. However, the first via hole 61 and the second via hole 63 can still be electrically connected to the electronic component 200 through the third pad 30 and the fourth pad 40, thus ensuring the possibility of detecting the voltage/current of the electronic component 200 correctly without an unexpected resistance.

Figure 3:
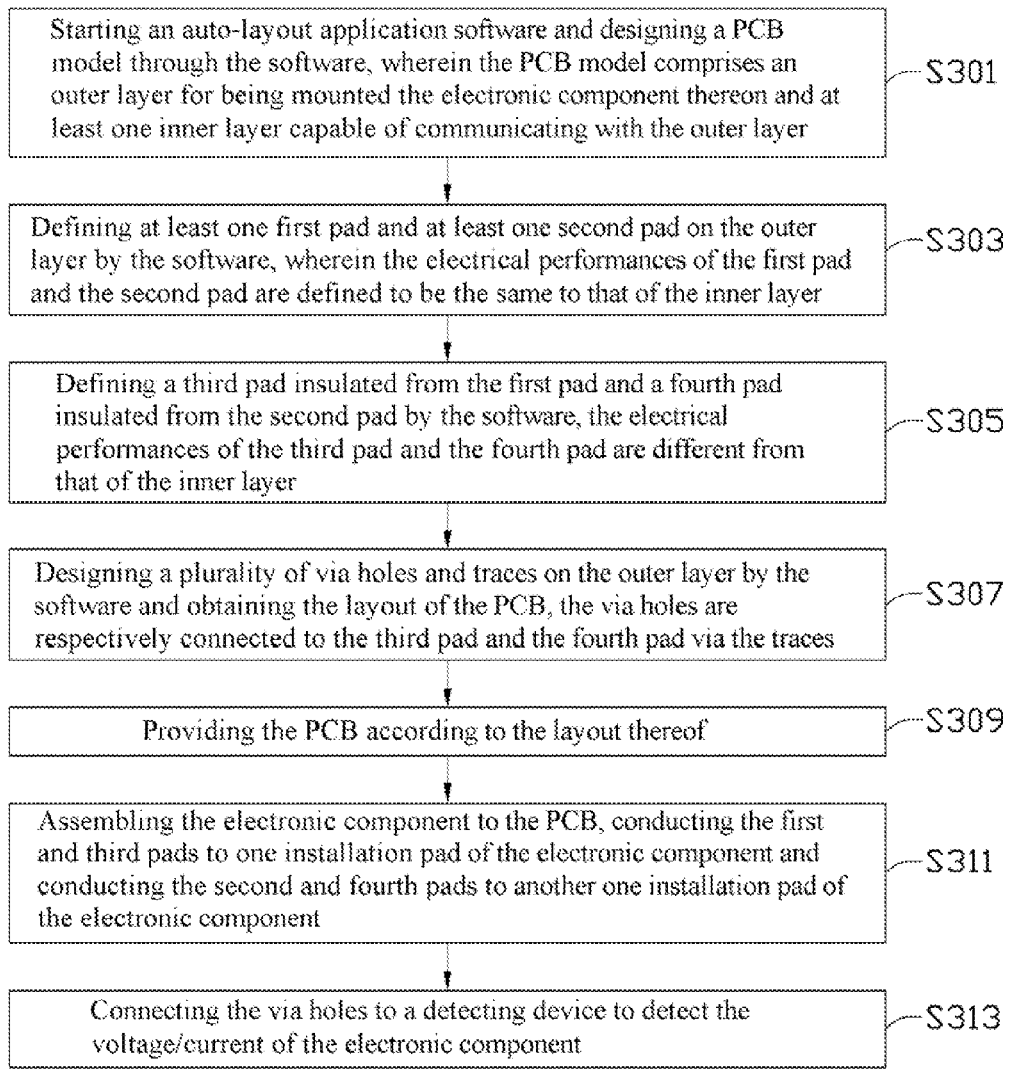
FIG. 3 is a flowchart of one embodiment of a voltage/current measuring method using the PCB.

Referring to FIG. 3, a voltage/current measuring method using the PCB 100 includes the following steps S301 to S313.

In step S301, an auto-layout application software are started and a PCB model is designed by the software. The PCB model includes an outer layer 101 for being mounted the at least one electronic component 200 to be detected defined thereon, and at least one inner layer 103 designed to be capable of communicating with the outer layer 101. In the present embodiment, the outer layer 101 and the inner layers 103 are copper layers. The electronic component 200 can be an inductor or a resistor. In the present embodiment, the electronic component 200 includes two installation pads to be soldered to the outer layer 101.

In step S303, at least one first pad 10 and at least one second pad 20 adjacent to the at least one first pad 10 are defined on the outer layer 101. Two opposite cutouts 50 are respectively defined on two adjacent edges of the first pad 10 and the second pad 20. In the present embodiment, each cutout 50 is defined on the middle of the edge. The electrical performance of the first pad 10 and the second pad 20 are defined to be the same to that of the inner layer 103.

In step S305, a third pad 30 and a fourth pad 40 are respectively defined on the cutouts 50 of the first pad 10 and the second pad 20 by the software. In detail, the third pad 30 and the fourth pad 40 are respectively positioned in the substantial central area of the first pad 10 and the second pad 20, symmetrically, with part of the edge surrounded by the first pad 10 and the second pad 20. It is understood that the third pad 30 and the fourth pad 40 also can be symmetrically defined at the corresponding corners of the first pad 10 and the second pad 20. Furthermore, the copper between the first pad 10 and the third pad 30 is removed to insulate the first pad 10 from the third pad 30. Similarly, the copper between the second pad 20 and the fourth pad 40 is also removed to insulate the second pad 20 from the fourth pad 40. The shapes of the third and fourth pads 30 and 40 are rectangles in the present embodiment. Note that the third and fourth pads 30 and 40 also can be in other shapes, such as circles or triangles. The size (e.g. the length and the width) of the third pad 30 is smaller than that of the first pad 10. The size of the fourth pad 40 is smaller than that of the second pad 20. The electrical performance of the third pad 30 is different from that of the first pad 10, that is, different from the inner layer 103. The electrical performance of the fourth pad 40 is different from that of the second pad 20, that is, different from the inner layer 103.

In step S305, a number of via holes are defined on the PCB model. In detail, the via holes includes a number of first via holes 61 and a number of second via holes 63 defined on the PCB model. Furthermore, at least one pair of traces 60 for transmitting signals are also designed on the outer layer 101 and are respectively lead from the third pad 30 and the fourth pad 40. At least one first via hole 61 is connected to the third pad 30 through one of the traces 60. At least one second via hole 63 is connected to the fourth pad 40 through the other trace 60. As such, the via holes will automatically avoid electrical connection to the inner layer 103, the third pad 30 and the fourth pad 40 may not be electrically connected to the inner layer 103. Thus, the layout of the PCB 100 is completed by the software.

In step S309, the PCB 100 is provided. The PCB 100 is manufactured according to the layout thereof.

In step S311, the electronic component 200 is assembled to the PCB 100. In the present embodiment, one installation pad of the electronic component 200 is soldered on the first and third pad 10 and 30 by soldering paste at the same time, the other installation pad of the electronic component 200 is also soldered on the second and fourth pad 20 and 40 by soldering paste at the same time, to electrically connect the electronic component 200 to the first pad 10 and the third pad 30, the second pad 20 and the fourth pad 40. As a result, the first via hole 61 can be electrically connected to the electronic component 200 through the third pad 30. The second via hole 63 can be electrically connected to the electronic component 200 through the fourth pad 40.

In step S313, the first via hole 61 and the second via hole 63 are connected to a detecting device (not shown), such as a voltmeter or an ammeter, to detect the voltage/current of the electronic component 200. Due to the different electrical performances between the third pad 30/the fourth pad 40 and the inner layer 103, the first via hole 61 and the second via hole 63 may be automatically avoidable to electrically connect to the inner layer 103 in design. However, the first via hole 61 and the second via hole 63 can still be electrically connected to the electronic component 200 to be detected through the third pad 30 and the fourth pad 40, thus ensuring the possibility of detecting the voltage/current of the electronic component 200 correctly without an unexpected resistance.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A printed circuit board (PCB), comprising:
a plurality of inner layers; and
an outer layer in communication with the inner layers;
wherein, the outer layer comprises a plurality of first, second, third and fourth pads, and a plurality of via holes, the electrical performances of the first and second pads are the same as that of the inner layers, the electrical performances of the third and fourth pads are different from that of the inner layers, each of the third pads is adjacent to a corresponding one of the first pads and insulated from the corresponding first pad, each of the fourth pads is adjacent to a corresponding one of the second pads and insulated from the corresponding second pad, the via holes comprises a plurality of first via holes and a plurality of second via holes, each first via hole is electrically connected to a corresponding one of the third pads each second via hole is electrically connected to a corresponding one of the fourth pads, wherein each of the first pads and the second pads defines a cutout extending from an edge to the center thereof, and each of the third pads and the fourth pads is partly received in a corresponding one of the cutouts.

2. The PCB of claim 1, further comprising a plurality of traces, wherein the first via hole is electrically connected to the corresponding third pad through one of the traces, and the second via hole is electrically connected to the corresponding fourth pad through another one of the traces.

3. The PCB of claim 1, wherein each cutout is defined on the middle of a respective one of the first pads and the second pads, and each third pad is opposite to a corresponding one of the fourth pads.

4. The PCB of claim 1, wherein each cutout is defined at a corner of a respective one of the first pads and the second pads, and each third pad is opposite to a corresponding one of the fourth pads.

5. The PCB of claim 1, wherein each third pad is partially surrounded by a corresponding one of the first pads, and each fourth pad is partially surrounded by a corresponding one of the second pads.

6. The PCB of claim 1, wherein the outer layer is mounted with a plurality of electronic components, each of the electronic components comprises a plurality of installation pads, and each of the installation pads is soldered to a corresponding one of the first pads and a corresponding one of the third pads at the same time or is soldered to a corresponding one of the second pads and a corresponding one of the fourth pads at the same time.

7. The PCB of claim 6, wherein the area of each of the installation pads is substantially equal to the corresponding one of the first pads or the second pads, each of the first pads defines a cutout in which at least a part of the corresponding one of the third pads are received, and each of the second pads defines a cutout in which at least a part of the corresponding one of the fourth pads are received.

8. The PCB of claim 1, wherein the first pads and the second pads are connected to the inner layers.

* * * * *